(12) United States Patent
Hattori et al.

(10) Patent No.: US 9,911,639 B2
(45) Date of Patent: *Mar. 6, 2018

(54) COMPOSITE SUBSTRATE, ELASTIC WAVE DEVICE, AND METHOD FOR PRODUCING ELASTIC WAVE DEVICE

(71) Applicant: NGK INSULATORS, LTD., Aichi (JP)

(72) Inventors: Ryosuke Hattori, Ichinomiya (JP); Yuji Hori, Owariasahi (JP); Tomoyoshi Tai, Inazawa (JP)

(73) Assignee: NGK INSULATORS, LTD., Aichi (JP)

( * ) Notice: Subject to any disclaimer, the term of this patent is extended or adjusted under 35 U.S.C. 154(b) by 277 days.

This patent is subject to a terminal disclaimer.

(21) Appl. No.: 14/811,953

(22) Filed: Jul. 29, 2015

(65) Prior Publication Data

US 2015/0328875 A1    Nov. 19, 2015

Related U.S. Application Data

(63) Continuation of application No. PCT/JP2014/053688, filed on Feb. 18, 2014.

(30) Foreign Application Priority Data

Feb. 19, 2013  (JP) .................. 2013-030161

(51) Int. Cl.
*H01L 21/30*       (2006.01)
*H01L 21/683*      (2006.01)
(Continued)

(52) U.S. Cl.
CPC ............ *H01L 21/6835* (2013.01); *B32B 7/02* (2013.01); *B32B 7/06* (2013.01); *B32B 7/12* (2013.01);
(Continued)

(58) Field of Classification Search
None
See application file for complete search history.

(56) References Cited

U.S. PATENT DOCUMENTS 7,408,286 B1    8/2008  Bhattacharjee et al.
2004/0253795 A1  12/2004  Martinez et al.
(Continued)

FOREIGN PATENT DOCUMENTS

CN    101689841 A    3/2010
CN    101849276 A    9/2010
(Continued)

OTHER PUBLICATIONS

International Search Report and Written Opinion for PCT Patent App. No. PCT/JP2014/053689 (dated Mar. 20, 2014) with English language translation of the Search Report.
(Continued)

*Primary Examiner* — Jack Chen
(74) *Attorney, Agent, or Firm* — Cermak Nakajima & McGowan LLP; Tomoko Nakajima

(57) ABSTRACT

A composite substrate 10 is formed by bonding together a piezoelectric substrate 12 and a support substrate 14 that has a lower thermal expansion coefficient than the piezoelectric substrate. The support substrate 14 is formed by directly bonding together a first substrate 14a and a second substrate 14b at a strength that allows separation with a blade, the first and second substrates being formed of the same material, and a surface of the first substrate 14a is bonded to the piezoelectric substrate 12, the surface being opposite to another surface of the first substrate 14a bonded to the second substrate 14b.

5 Claims, 3 Drawing Sheets

(51) Int. Cl.

| | | |
|---|---|---|
| *B32B 38/10* | (2006.01) | |
| *B32B 9/00* | (2006.01) | |
| *B32B 9/04* | (2006.01) | |
| *B32B 7/02* | (2006.01) | |
| *H03H 9/25* | (2006.01) | |
| *H03H 3/10* | (2006.01) | |
| *B32B 7/06* | (2006.01) | |
| *B32B 18/00* | (2006.01) | |
| *H01L 21/78* | (2006.01) | |
| *B32B 7/12* | (2006.01) | |
| *B32B 27/08* | (2006.01) | |
| *B32B 27/20* | (2006.01) | |
| *B32B 27/28* | (2006.01) | |
| *H01L 41/187* | (2006.01) | |
| *H03H 9/02* | (2006.01) | |
| *B32B 37/10* | (2006.01) | |
| *H03H 3/08* | (2006.01) | |

(52) U.S. Cl.
CPC ........... *B32B 9/005* (2013.01); *B32B 9/04* (2013.01); *B32B 18/00* (2013.01); *B32B 27/08* (2013.01); *B32B 27/20* (2013.01); *B32B 27/283* (2013.01); *B32B 38/10* (2013.01); *H01L 21/78* (2013.01); *H03H 3/10* (2013.01); *H03H 9/25* (2013.01); *B32B 37/10* (2013.01); *B32B 2264/105* (2013.01); *B32B 2307/20* (2013.01); *B32B 2307/206* (2013.01); *B32B 2307/538* (2013.01); *B32B 2309/02* (2013.01); *B32B 2309/105* (2013.01); *B32B 2457/00* (2013.01); *B32B 2457/14* (2013.01); *H01L 41/1873* (2013.01); *H03H 3/08* (2013.01); *H03H 9/02574* (2013.01); *Y10T 428/12597* (2015.01)

(56) References Cited

U.S. PATENT DOCUMENTS

| | | |
|---|---|---|
| 2007/0120623 A1 | 5/2007 | Sakiyama et al. |
| 2008/0014712 A1 | 1/2008 | Bourdelle et al. |
| 2008/0193142 A1 | 8/2008 | Kopp et al. |
| 2010/0088868 A1 | 4/2010 | Kando et al. |
| 2010/0092786 A1 | 4/2010 | Utsumi et al. |
| 2010/0108248 A1 | 5/2010 | Hayakawa et al. |
| 2010/0182101 A1 | 7/2010 | Suzuki |
| 2010/0216294 A1 | 8/2010 | Rabarot et al. |
| 2010/0218977 A1 | 9/2010 | Inoue et al. |
| 2010/0276723 A1 | 11/2010 | Utsumi et al. |
| 2014/0173862 A1 | 6/2014 | Kando et al. |
| 2015/0328875 A1 | 11/2015 | Hattori et al. |
| 2015/0380290 A1 | 12/2015 | Ide et al. |

FOREIGN PATENT DOCUMENTS

| | | |
|---|---|---|
| JP | 10-012547 A | 1/1998 |
| JP | 2005-005708 A | 1/2005 |
| JP | 2005-295362 A | 10/2005 |
| JP | 2005-302805 A | 10/2005 |
| JP | 2007-150931 A | 6/2007 |
| JP | 2007-324195 A | 12/2007 |
| JP | 2008-021971 A | 1/2008 |
| JP | 2009-507253 A | 2/2009 |
| JP | 2009-094661 A | 4/2009 |
| JP | 2009-117707 A | 5/2009 |
| JP | 2009-164314 A | 7/2009 |
| JP | 2010-1099909 A | 5/2010 |
| JP | 2010-187373 A | 8/2010 |
| JP | 2010-199507 A | 9/2010 |
| JP | 2011503839 A | 1/2011 |
| JP | 2012-213244 A | 11/2012 |
| WO | WO2011/104461 A2 | 9/2011 |
| WO | WO2012/028518 A1 | 3/2012 |

OTHER PUBLICATIONS

English language translation of the International Preliminary Report on Patentability for PCT Patent App. No. PCT/JP2014/053689 (dated Aug. 25, 2015).

Office Action for Japanese Patent Ap. No. 2015-501444 (dated Jan. 5, 2016).

International Search Report and Written Opinion for PCT Patent App. No. PCT/JP2014/053688 (dated Apr. 1, 2014) with partial English language translation of Search Report.

Office Action for Taiwanese Patent App. No. 10620120270 (dated Feb. 7, 2017).

European Search Report for EP Patent App. No. 14754763.2 (dated May 23, 2016).

English language translation of the International Preliminary Report on Patentability for PCT Patent App. No. PCT/JP2014/053688 (dated Aug. 25, 2015).

Office Action from Japanese Patent App. No. 2015-501444 (dated Sep. 8, 2015).

Office Action from co-pending U.S. Appl. No. 14/825,715 dated Jan. 13, 2017.

Office Action from Chinese Patent App. No. 201480009140.3 (dated Dec. 13, 2016).

(a)

(b)

(c)

(d)

COMPOSITE SUBSTRATE, ELASTIC WAVE DEVICE, AND METHOD FOR PRODUCING ELASTIC WAVE DEVICE

BACKGROUND OF THE INVENTION

1. Field of the Invention

The present invention relates to a composite substrate, an elastic wave device, and a method for producing an elastic wave device.

2. Description of the Related Art

In recent years, for the purpose of improving the temperature characteristics of elastic wave devices, a composite substrate formed by bonding a thin piezoelectric substrate onto a support substrate having a low thermal expansion coefficient is used. For example, Patent Literature 1 discloses a composite substrate having a structure formed by bonding together a LT substrate (LT is the abbreviation of lithium tantalate) serving as a piezoelectric substrate and a silicon substrate serving as a support substrate via an adhesive layer formed of an epoxy adhesive.

Production of elastic wave devices with such a composite substrate has the following problems. First, since the composite substrate warps considerably in response to changes in temperature, during production processes for elastic wave devices at various process temperatures, the patterning accuracy is degraded or it becomes difficult to automatically handle the composite substrate. Second, the composite substrate has a low strength and the substrate becomes cracked during a heating process in production of elastic wave devices.

In order to overcome these problems, increasing the thickness of the support substrate in the composite substrate in Patent Literature 1 may be considered, for example. By simply increasing the thickness of the support substrate, the rigidity is enhanced and warpage of the composite substrate is suppressed. In addition, damage due to warpage of the substrate is also reduced. It has also been proposed that, in Patent Literature 2, a compensation layer that has substantially the same thermal expansion coefficient as a piezoelectric substrate and that has a thickness similar to that of the piezoelectric substrate is formed on a surface of the support substrate, the surface being opposite to another surface of the support substrate bonded to the piezoelectric substrate. In such a composite substrate, the piezoelectric substrate and the compensation layer similarly expand and contract in response to changes in temperature and hence warpage of the composite substrate is suppressed.

CITATION LIST

Patent Literature

PTL 1: Japanese Unexamined Patent Application Publication No. 2007-150931
PTL 2: U.S. Pat. No. 7,408,286

SUMMARY OF THE INVENTION

In the composite substrate in PTL 1, by increasing the thickness of the support substrate to about 500 μm, for example, the above-described problems are overcome. However, elastic wave devices produced from this composite substrate have an excessively large thickness, which is against the trend toward reduction in thickness and results in a low commercial value. For this reason, the back surfaces of the support substrates of the produced elastic wave devices need to be thinned by polishing. However, the polishing incurs a high cost, which results in an increase in the cost of elastic wave devices. On the other hand, in the composite substrate in PTL 2, a compensation layer is added to the back surface of the support substrate. Accordingly, the cost of the elastic wave devices produced from the composite substrate increases, which is problematic.

The present invention has been accomplished in order to overcome the problems. A main object is to achieve reduction in warpage of a composite substrate and enhancement of strength of the composite substrate and to suppress the corresponding increase in the production cost of elastic wave devices.

In order to achieve the main object, the present invention employs the following constitutions.

A composite substrate according to the present invention is a composite substrate formed by bonding together a piezoelectric substrate and a support substrate that has a lower thermal expansion coefficient than the piezoelectric substrate, wherein the support substrate is formed by directly bonding together a first substrate and a second substrate at a strength that allows separation with a blade, the first and second substrates being formed of the same material; and a surface of the first substrate is bonded to the piezoelectric substrate, the surface being opposite to another surface of the first substrate bonded to the second substrate.

A method for producing an elastic wave device according to the present invention includes the steps of:

(a) preparing the above-described composite substrate;
(b) forming electrodes for elastic wave devices, on a surface of the piezoelectric substrate of the composite substrate;
(c) removing the second substrate from the first substrate by separation with a blade; and
(d) dicing the composite substrate to obtain elastic wave devices.

An elastic wave device according to the present invention is obtained by the above-described method for producing an elastic wave device according to the present invention.

In a composite substrate according to the present invention, a support substrate is formed by directly bonding together a first substrate and a second substrate at a strength that allows separation with a blade, the first and second substrates being formed of the same material. Accordingly, the support substrate has a large thickness, compared with a case where the first substrate alone is used as the support substrate. As a result, warpage of the composite substrate in response to changes in temperature can be reduced and the strength of the composite substrate can also be increased. After elastic wave devices are formed, the thickness of the support substrate can be easily decreased by removing the second substrate from the first substrate by separation with a blade. This is thus achieved at a low cost, compared with a case where a thick support substrate is thinned by polishing. As a result, the corresponding increase in the production cost of elastic wave devices can be suppressed. The second substrate having been removed can be recycled for producing another composite substrate according to the present invention, which also contributes to cost reduction.

In a method for producing an elastic wave device according to the present invention, the above-described composite substrate according to the present invention is prepared; electrodes for elastic wave devices are formed on a surface of the piezoelectric substrate of the composite substrate; the second substrate is removed from the first substrate by separation with a blade; and dicing is subsequently carried out to obtain elastic wave devices. After electrodes for elastic wave devices are formed, the thickness of the support substrate can be easily decreased by removing the second substrate from the first substrate by separation with a blade. This is thus achieved at a low cost, compared with a case where a thick support substrate is thinned by polishing. As a result, the corresponding increase in the production cost of elastic wave devices can be suppressed.

DESCRIPTION OF THE PREFERRED EMBODIMENTS

Figure 1:
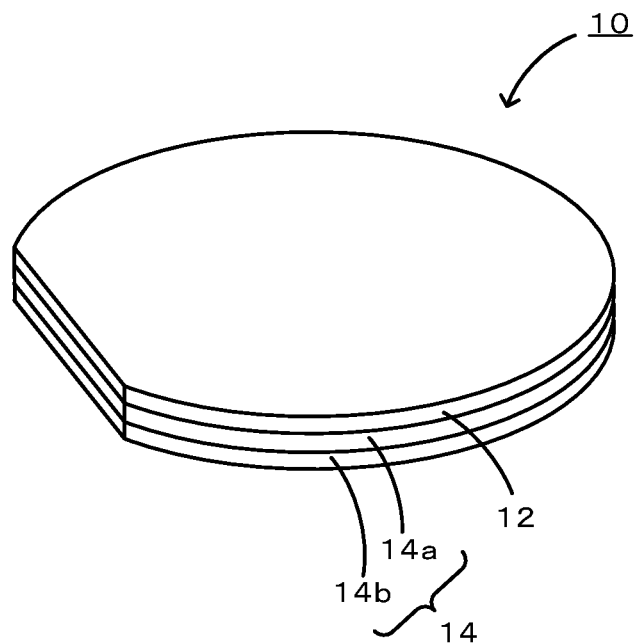
FIG. 1 is a schematic sectional view of a composite substrate 10.

Hereinafter, embodiments according to the present invention will be described with reference to drawings. FIG. 1 is a schematic sectional view of a composite substrate 10 according to an embodiment. This composite substrate 10 includes a piezoelectric substrate 12 and a support substrate 14.

The piezoelectric substrate 12 is a substrate that can propagate elastic waves. The material for the piezoelectric substrate 12 may be lithium tantalate (LT), lithium niobate (LN), a lithium niobate-lithium tantalate solid-solution single crystal, rock crystal, lithium borate, zinc oxide, aluminum nitride, langasite (LGS), langatate (LGT), or the like. Of these, LT or LN is preferred. This is because LT and LN allow surface acoustic waves to be propagated at high speeds and have large electromechanical coupling factors and hence are suitable for elastic wave devices for high frequencies and wide-band frequencies. The piezoelectric substrate 12 is not particularly limited in terms of size and may have, for example, a diameter of 50 to 150 mm and a thickness of 0.2 to 50 μm.

The support substrate 14 has a lower thermal expansion coefficient than the piezoelectric substrate 12 and is bonded to the back surface of the piezoelectric substrate 12 directly or via an organic adhesive layer. The support substrate 14 has a lower thermal expansion coefficient than the piezoelectric substrate 12, so that variations in the size of the piezoelectric substrate 12 in response to changes in temperature are suppressed, and temperature-dependent changes in frequency characteristics of the composite substrate 10 serving as elastic wave devices can be suppressed. This support substrate 14 is formed by directly bonding together a first substrate 14a and a second substrate 14b at a strength that allows separation with a blade, the first and second substrates 14a and 14b being formed of the same material. The support substrate 14 is bonded to the piezoelectric substrate 12 via a surface of the first substrate 14a, the surface being opposite to the other surface of the first substrate 14a bonded to the second substrate 14b. The material for the support substrate 14 may be silicon, sapphire, aluminum nitride, alumina, borosilicate glass, quartz glass, or the like, and is preferably silicon. The support substrate 14 has a size, for example, a diameter of 50 to 150 mm and a thickness of 200 to 1200 μm. The first and second substrates 14a and 14b have a size, for example, a diameter of 50 to 150 mm and a thickness of 100 to 600 μm. The support substrate 14 preferably has a higher Young's modulus than the piezoelectric substrate 12.

Table 1 shows the thermal expansion coefficients of representative materials used for the piezoelectric substrate 12 and the support substrate 14.

TABLE 1

| | Material | Thermal Expansion Coefficient (ppm/K) |
| --- | --- | --- |
| Piezoelectric Substrate | Lithium Tantalate (LT) | 16.1 |
| | Lithium Niobate (LN) | 15.4 |
| | Crystal | 13.7 |
| | Lithium Borate | 13 |
| Support Substrate | Silicon | 3 |

Figure 2:
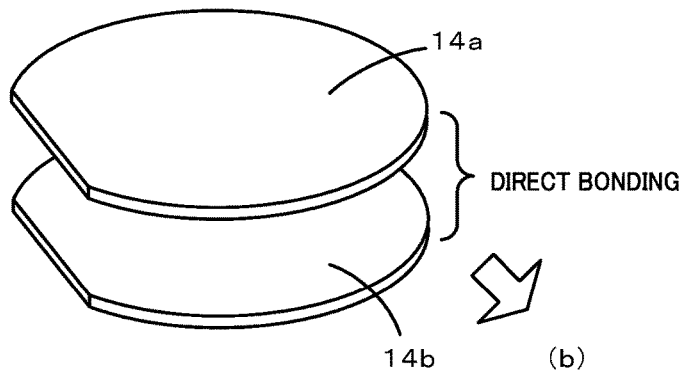
FIG. 2 is a schematic sectional view of steps for producing a composite substrate 10.
Figure 2:
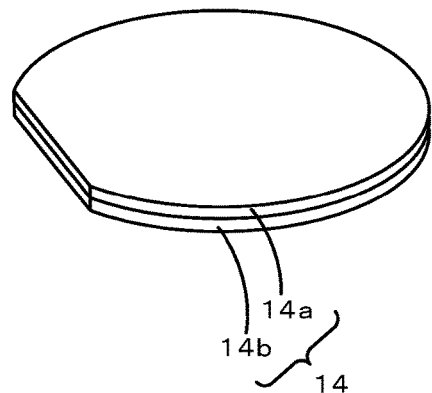
Figure 2:
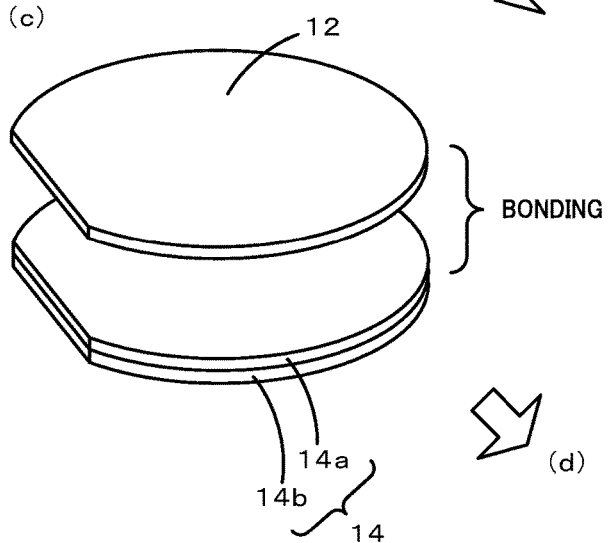
Figure 2:
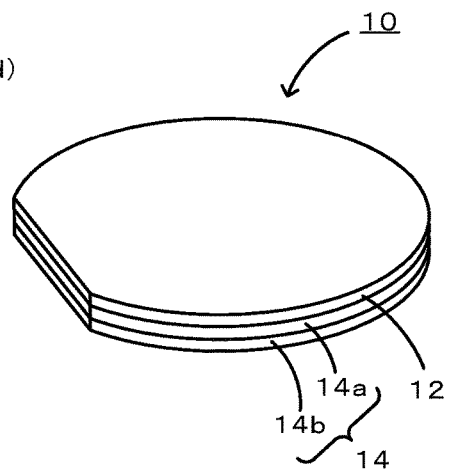

Hereinafter, a method for producing the composite substrate 10 will be described with reference to FIG. 2. FIG. 2 is a schematic sectional view of steps for producing the composite substrate 10.

First, the first and second substrates 14a and 14b, which are disc-shaped and formed of the same material, are prepared (refer to FIG. 2(a)). The substrates 14a and 14b are directly bonded together to produce the support substrate 14 (refer to FIG. 2(b)). An example of a process of directly bonding together the substrates 14a and 14b is as follows. First, bonding surfaces of the substrates 14a and 14b are washed to remove foreign matter adhering to the bonding surfaces. Subsequently, the bonding surfaces of the substrates 14a and 14b are irradiated with ion beams of an inert gas such as argon, so that remaining impurities (oxide films, adsorbate, and the like) are removed and the bonding surfaces are activated. After that, in a vacuum, the substrates 14a and 14b are bonded together at room temperature. The bonding strength for the substrates 14a and 14b is set to a strength that allows the substrates 14a and 14b to be separated by insertion of a blade having a thickness of 100 μm. In order to achieve such a strength, the surface roughness of the bonding surfaces, irradiation time with ion beams, a pressure applied during bonding, and the like are determined on the basis of experiments. In a case where the substrates 14a and 14b are both, for example, silicon substrates, since silicon generally has a bulk strength of 2 to 2.5 J/m$^2$, the Si—Si bonding energy between the substrates 14a and 14b is set to a value lower than the strength, for example, 0.05 to 0.6 J/m$^2$. A value lower than 0.05 J/m$^2$ may cause separation during production of elastic wave devices. A value higher than 0.6 J/m$^2$ may cause hindrance to smooth insertion of a blade.

Subsequently, the support substrate 14 and the piezoelectric substrate 12 are bonded together (refer to FIG. 2(c)). Specifically, the surface of the first substrate 14a of the support substrate 14 is bonded to the back surface of the piezoelectric substrate 12. This bonding may be achieved by direct bonding or bonding via an organic adhesive layer. The direct bonding was described before and hence the description thereof is omitted here. Note that the surface roughness of the bonding surfaces, irradiation time with ion beams, a pressure applied during bonding, and the like are determined such that the bonding strength is equivalent to or higher than a silicon bulk strength of 2 to 2.5 J/m$^2$. In a case where the bonding via an organic adhesive layer is performed, first, an organic adhesive is uniformly applied to one or both of the surface of the support substrate 14 and the back surface of the piezoelectric substrate 12; and, while the substrates are overlapped, the organic adhesive is solidified to thereby achieve bonding. In this way, the composite substrate 10 is obtained (refer to FIG. 2(d)). The process for direct bonding is not particularly limited to the process described here and may be another process using plasma, neutral atom beams, or the like.

Figure 3:
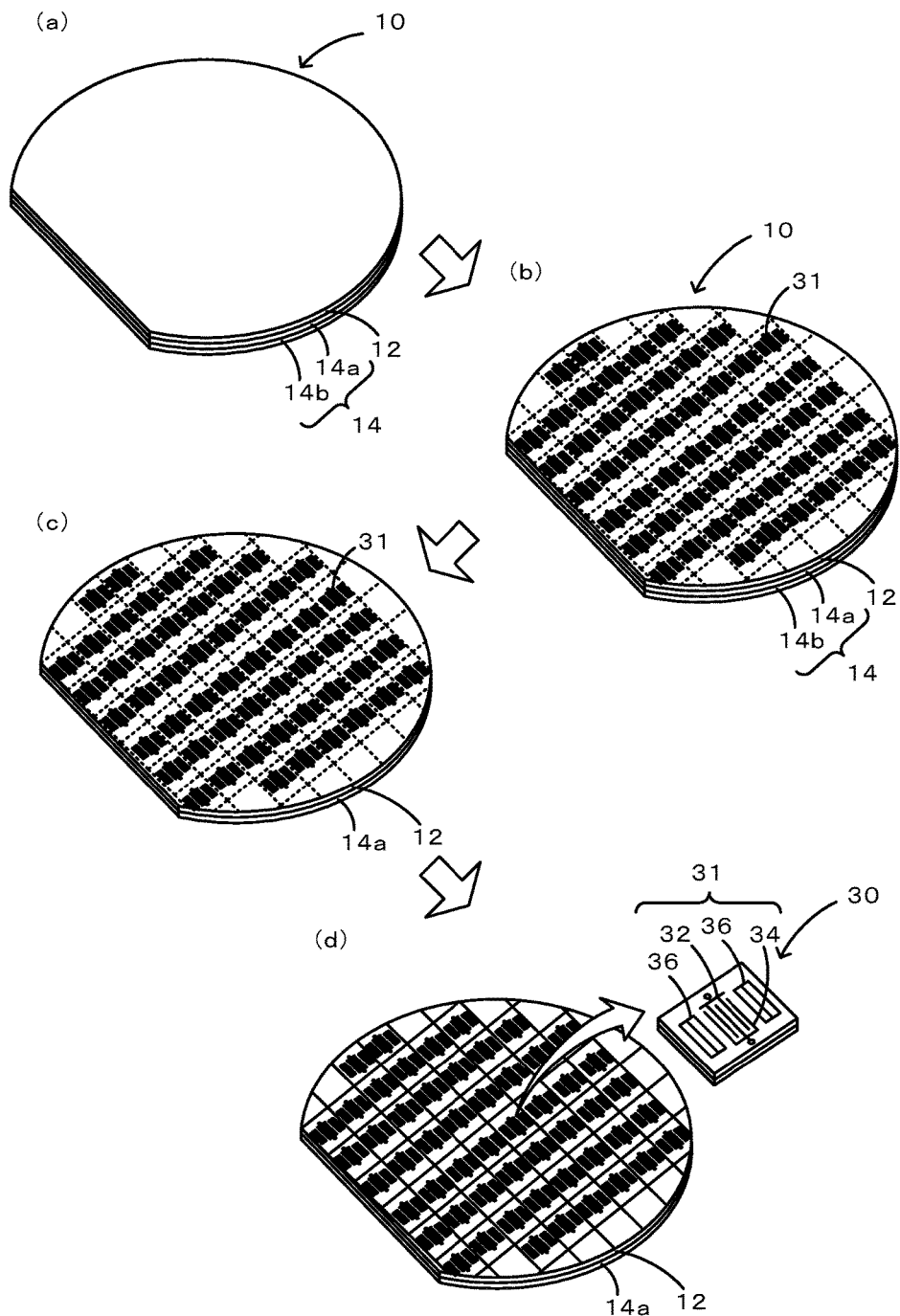
FIG. 3 is a schematic sectional view of steps for producing an elastic wave device 30.

Hereinafter, a method for producing an elastic wave device 30 from the composite substrate 10 will be described with reference to FIG. 3. FIG. 3 is a schematic sectional view of steps for producing the elastic wave device 30.

First, the composite substrate 10 is prepared (refer to FIG. 3(a)). This was described before with reference to FIG. 2 and hence the description thereof is omitted here.

Subsequently, electrodes 31 for elastic wave devices are formed on the surface of the piezoelectric substrate 12 of the composite substrate 10 (refer to FIG. 3(b)). The surface of the piezoelectric substrate 12 is partitioned such that a large number of elastic wave devices are formed. The electrodes 31 for elastic wave devices are formed at positions corresponding to elastic wave devices by photolithographic techniques. As illustrated in FIG. 3(d), each electrode 31 includes IDT electrodes 32 and 34 and reflection electrodes 36.

Subsequently, the second substrate 14b is removed from the first substrate 14a by separation using a blade having a thickness of 100 µm (refer to FIG. 3(c)). The surface (separated surface) of the first substrate 14a from which the second substrate 14b has been separated has a sufficiently low surface roughness Ra and hence does not particularly need polishing but may be polished when necessary. The separated surface of the first substrate 14a contains, in addition to elements derived from the material for the first substrate 14a, elements derived from the material for the vacuum chamber used during direct bonding. For example, in a case where the material for the vacuum chamber is stainless steel, the Fe element and the Cr element are contained. The second substrate 14b separated from the first substrate 14a can be recycled for the production of another composite substrate 10.

Finally, dicing along boundaries is carried out to obtain a large number of elastic wave devices 30 (refer to FIG. 3(d)). Upon application of high frequency signals to the IDT electrode 32 on the input side of each elastic wave device 30 produced, an electric field is generated between electrodes and surface acoustic waves are generated and propagate on the piezoelectric substrate 12. The propagated surface acoustic waves can be output as electric signals from the IDT electrode 34, which is disposed on the output side in the propagation direction. That is, the elastic wave device 30 is a surface acoustic wave device.

In the embodiment described above, the support substrate 14 is formed by bonding together the first substrate 14a and the second substrate 14b, which are formed of the same material. Accordingly, the support substrate 14 has a large thickness, compared with a case where the first substrate 14a alone is used as the support substrate 14. As a result, warpage of the composite substrate 10 in response to changes in temperature can be reduced and the strength of the composite substrate 10 can also be increased. After the electrodes 31 for elastic wave devices are formed, the thickness of the support substrate 14 can be easily decreased by removing the second substrate 14b from the first substrate 14a by separation with a blade. This is thus achieved at a low cost, compared with a case where a bulk support substrate having the same thickness as the support substrate 14 is thinned by polishing. As a result, an increase in the production cost of elastic wave devices 30 can be suppressed. The second substrate 14b having been removed can be recycled for producing another composite substrate 10, which also contributes to cost reduction.

Note that the present invention is not limited to the above-described embodiments at all. It is obvious that the present invention can be practiced as various embodiments within the technical scope of the present invention.

EXAMPLES

Example 1

Two silicon substrates having a diameter of 100 mm and a thickness of 250 µm were prepared as first and second substrates. Each silicon substrate prepared had two mirror-finished surfaces. Each silicon substrate was washed to remove foreign matter from the surfaces and subsequently introduced into a vacuum chamber formed of stainless steel. The atmosphere within the chamber was adjusted to a vacuum on the order of $1 \times 10^{-6}$ Pa. Within this atmosphere, a surface of each silicon substrate was irradiated with Ar ion beams for 180 sec. Subsequently, the beam-irradiated surfaces of the silicon substrates were overlapped so as to be in contact with each other and a load of 500 kgf was then applied to bond together the silicon substrates. Thus, a support substrate having a total thickness of 500 µm was obtained. In addition to this support substrate, a LT substrate having two mirror-finished surfaces, a diameter of 100 mm, and a thickness of 230 µm was prepared as a piezoelectric substrate. The LT substrate and the support substrate are washed again and introduced into the vacuum chamber. The atmosphere within the chamber was adjusted to a vacuum on the order of $1 \times 10^{-6}$ Pa. Within this atmosphere, a surface of the LT substrate and a surface of the support substrate (the surface of the first substrate) were irradiated with Ar ion beams for 300 sec. Subsequently, the beam-irradiated surface of the LT substrate and the beam-irradiated surface of the support substrate were overlapped so as to be in contact with each other, and a load of 2000 kgf was then applied to bond together the two substrates. Thus, a composite substrate having a trilayer structure was obtained.

In the composite substrate, the LT substrate serving as the piezoelectric substrate was polished to about 20 µm. The amount of warpage of the composite substrate between before and after the polishing was measured and found to be about 25 µm. The amount of warpage of the polished composite substrate between before and after heating at 100° C. was measured and found to be about 250 µm.

Comparative Example 1

A composite substrate was produced as in Example 1 except that a single silicon substrate having a diameter of 100 mm and a thickness of 250 µm was used as the support substrate. The amount of warpage of the composite substrate between before and after the polishing was measured and found to be about 60 µm. The amount of warpage between before and after heating at 100° C. was measured and found to be about 1500 µm.

Summary of Amounts of Warpage

Table 2 summarizes the results of Example 1 and Comparative Example 1 in terms of amount of warpage. As is obvious from Table 1, the effect of considerably reducing warpage was observed in Example 1 because the support substrate was thicker than that in Comparative Example 1.

TABLE 2

| | Amount of Warpage between Before and After Polishing of LT Substrate | Amount of Warpage between Before and After Heating at 100° C. |
|---|---|---|
| Example 1 | About 25 μm | About 250 μm |
| Comparative Example 1 | About 60 μm | About 1500 μm |

Example 2

The polished composite substrate in Example 1 was subjected to patterning for electrodes for elastic wave devices (surface acoustic wave devices). A blade was then inserted into the Si—Si bonding boundary to divide the bonded substrate. This provided a bilayer composite substrate in which the LT substrate and the Si substrate (first substrate) were bonded together and a monolayer Si substrate (second substrate). The separated surface of the bilayer composite substrate and the separated surface of the monolayer Si substrate were observed with an AFM (atomic force microscope). As a result, the wafers were found to have a surface roughness Ra of about 0.4 nm and the surfaces were in a good condition without the need of polishing. The separated surfaces were subjected to elemental analysis by energy dispersive X-ray spectrometry (EDS). As a result, in addition to the Si element, the Fe element and the Cr element were detected. The Fe element and the Cr element were derived from the vacuum chamber. Entry of these elements occurred during direct bonding between the first substrate and the second substrate.

A crack-opening method was used to measure the bonding energy per unit area. As a result, the bonding energy between the LT substrate and the Si substrate (first substrate) was found to be about 2.5 $J/m^2$. The bonding energy between the Si substrate (first substrate) and the Si substrate (second substrate) was found to be about 0.2 $J/m^2$. In general, a silicon bulk strength is 2 to 2.5 $J/m^2$. The bonding energy between the LT substrate and the Si substrate (first substrate) is equal to or more than the bulk strength. In contrast, the bonding energy between the Si substrate (first substrate) and the Si substrate (second substrate) is lower than the bulk strength, which indicates that the substrates can be separated with a blade. The crack-opening method is a method of inserting a blade at the bonding interface and, on the basis of a distance for which the blade is inserted, the surface energy of the bonding interface is determined. The blade used was a product No. 99077 (blade length: about 37 mm, thickness: 0.1 mm, material: stainless steel) manufactured by FEATHER Safety Razor Co., Ltd.

The present application claims priority from Japanese patent application No. 2013-30161 filed on Feb. 19, 2013, the entire contents of which are incorporated herein by reference.

What is claimed is:

1. A composite substrate formed by bonding together a piezoelectric substrate and a support substrate that has a lower thermal expansion coefficient than the piezoelectric substrate,
    wherein the support substrate is formed by directly bonding together a first substrate and a second substrate at a strength that allows separation with a blade, the first and second substrates being formed of the same material; and a surface of the first substrate is bonded to the piezoelectric substrate, the surface being opposite to another surface of the first substrate bonded to the second substrate.

2. The composite substrate according to claim 1,
    wherein the first and second substrates are both silicon substrates.

3. The composite substrate according to claim 1,
    wherein the strength that allows separation with a blade corresponds to a bonding energy per unit area of the first and second substrates in a range of 0.05 to 0.6 $J/m^2$.

4. The composite substrate according to claim 1,
    wherein the first and second substrates have a thickness of 100 to 600 μm.

5. The composite substrate according to claim 1,
    wherein iron element and chromium element are contained between the first substrate and the second substrate.

* * * * *